(12) United States Patent
Zimmermann et al.

(10) Patent No.: US 8,656,086 B2
(45) Date of Patent: Feb. 18, 2014

(54) SYSTEM AND METHOD FOR AUTONOMOUS NAND REFRESH

(75) Inventors: Arnaldo Zimmermann, Fremont, CA (US); James Imoto, Newark, CA (US); Livio Ceci, Fremont, CA (US)

(73) Assignee: Avocent Corporation, Huntsville, AL (US)

( * ) Notice: Subject to any disclaimer, the term of this patent is extended or adjusted under 35 U.S.C. 154(b) by 290 days.

(21) Appl. No.: 12/962,781

(22) Filed: Dec. 8, 2010

(65) Prior Publication Data

US 2012/0151260 A1    Jun. 14, 2012

(51) Int. Cl.
*G06F 12/00* (2006.01)

(52) U.S. Cl.
USPC .................... 711/103; 711/165; 711/E12.002

(58) Field of Classification Search
USPC .................................. 711/103, 165, E12.002
See application file for complete search history.

(56) References Cited

U.S. PATENT DOCUMENTS

| | | | |
|---|---|---|---|
| 7,757,101 B2 * | 7/2010 | Nonaka et al. ............... | 713/194 |
| 2005/0162962 A1 | 7/2005 | Shirota et al. | |
| 2006/0109725 A1 | 5/2006 | Yoon et al. | |
| 2007/0194454 A1 | 8/2007 | Hanawa et al. | |
| 2009/0327581 A1 | 12/2009 | Coulson | |
| 2010/0142276 A1 | 6/2010 | Kasuga | |
| 2011/0191306 A1 * | 8/2011 | Akagawa et al. ............ | 707/692 |

OTHER PUBLICATIONS

International Search Report and Written Opinion mailed on Mar. 19, 2012 in PCT/US2011/059695.

* cited by examiner

*Primary Examiner* — Reginald Bragdon
*Assistant Examiner* — Mehdi Namazi
(74) *Attorney, Agent, or Firm* — Davidson Berquist Jackson & Gowdey

(57) ABSTRACT

A background scheduler is provided that utilizes low-level communications (e.g., communications with a generic or controller-specific solid state, non-volatile memory driver) to control locking, reading, rewriting and unlocking of pages of data in the non-volatile memory. Such low-level communications cause data to be rewritten to the non-volatile memory independent of the file system in an effort to avoid data loss prior to an estimated data retention period.

26 Claims, 5 Drawing Sheets

SYSTEM AND METHOD FOR AUTONOMOUS NAND REFRESH

FIELD OF INVENTION

The present invention is directed to a system and method for avoiding data loss in non-volatile solid state memories, and, in one embodiment, to a system and method of autonomously refreshing NAND memories before data loss occurs.

DISCUSSION OF THE BACKGROUND

Data bits in NAND memories are stored as charges injected to the floating gate cells of MOSFETs. The design of NAND architecture allows the existence of bad blocks in a certain percentage, either due to imperfections in the manufacturing process or developed during its use. A block is marked invalid when a memory location turns bad, which can occur due to a number of factors (e.g., write or program disturb, read disturb, endurance failure or loss of gate charge). As memory errors are a fact of life with NAND memories, Error Correction Codes (ECC) are widely used for error detection and correction, but data retention is of primary concern at high temperature applications, when errors non-correctable with common ECC algorithms may develop. Manufacturer specified data retention has been quoted as 10 years at 25° C., but discharge rate is temperature-dependent as it is a physical phenomenon governed by the Arrhenius equation given by:

$$AF = e^{-\frac{E_a}{k}\left[\frac{1}{T_2}-\frac{1}{T_1}\right]}$$

where AF=Acceleration factor, $E_a$=Activation energy (0.6 eV for data retention), k=Boltzmann's constant ($8.623 \times 10^{-5}$ eV/K), $T_1$=Application junction temperature in Kelvin, and $T_2$=Accelerated stress junction temperature in Kelvin. The equation gives the temperature behavior in the table below, clearly showing a steep decrease in reliability of the data stored in the memory as temperature rises.

| Temperature in deg C. | Retention time in months |
|---|---|
| 25 | 120 |
| 30 | 82 |
| 35 | 56 |
| 40 | 39 |
| 45 | 28 |
| 50 | 20 |
| 55 | 14 |
| 60 | 10 |
| 65 | 8 |
| 70 | 6 |

This may cause data corruption beyond the capability of an embedded ECC algorithm, leading to catastrophic system failure. Values for the Arrhenius acceleration factor show that likely to happen in less than one year if an appliance is exposed to an environment such that the temperature of the silicon die of the memory (junction temperature in the equation) reaches about 60° C.

Existing solutions make use of error correcting code (ECC) algorithms that can detect and correct a small number of bit-flips per page. In order to correct a higher number of bit-flips, more complex ECC algorithms are required and are usually implemented by software. Since ECC calculation is necessary on every NAND access, software ECC algorithms affect the overall availability of the CPU, while they do not prevent data retention loss if they correct the errors during reads without rewriting the page. Thus, data retention loss will eventually develop in the long run as result of the physical characteristics of the NAND device and the operating temperature.

BRIEF DESCRIPTION OF THE DRAWINGS

The following description, given with respect to the attached drawings, may be better understood with reference to the non-limiting examples of the drawings, wherein.

DISCUSSION OF THE PREFERRED EMBODIMENTS

Figure 1:
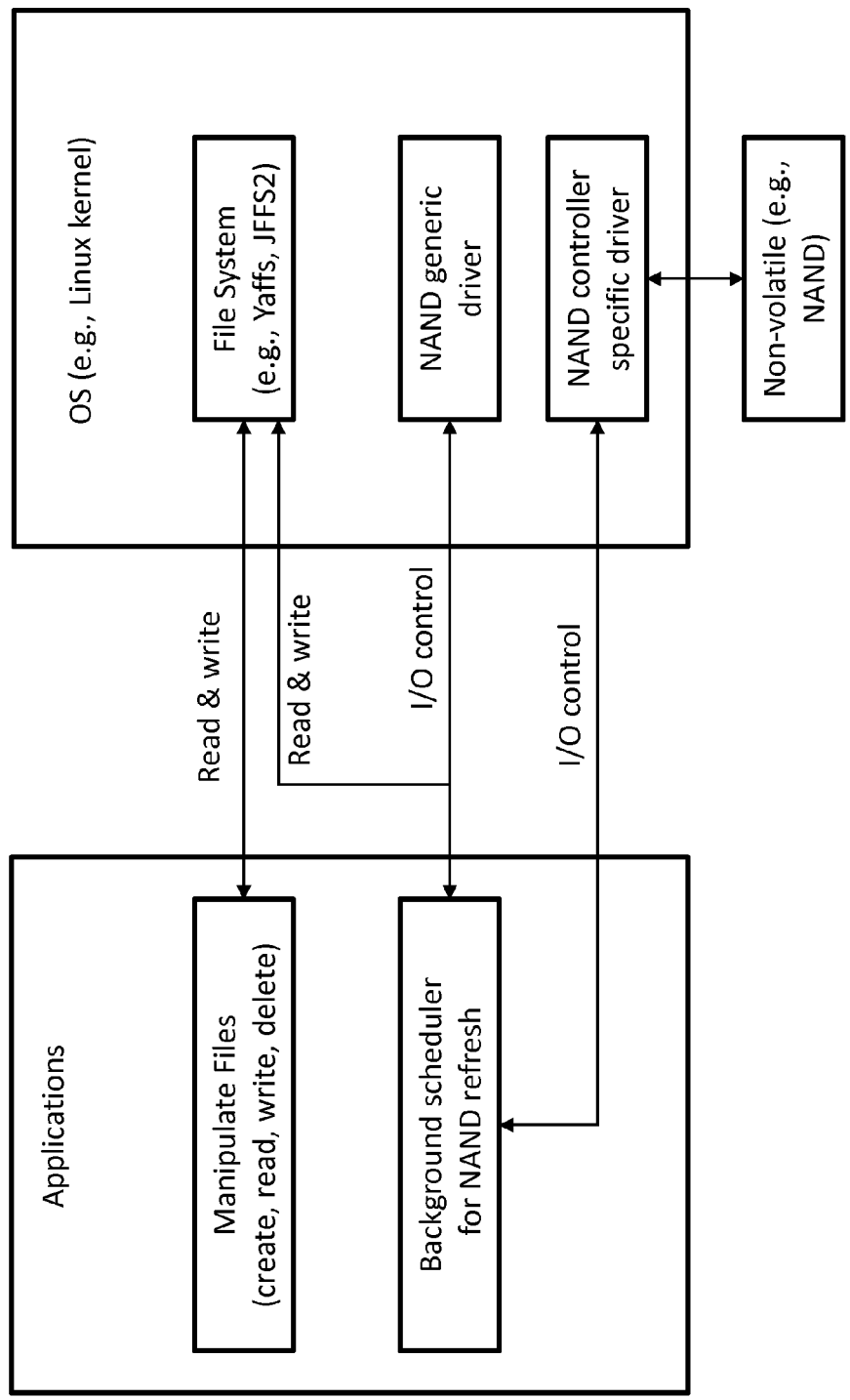
FIG. 1 is a block diagram illustrating interactions between applications and a non-volatile solid state memory.

Turning to FIG. 1, a block diagram illustrates applications interacting with a non-volatile solid state memory (e.g., a NAND flash memory) through a file system interface as well as using low-level I/O control calls (e.g., known as "ioctls" on Unix-style operating systems). General applications typically utilize the file system interface to manipulate files (e.g., by utilizing file system routines to create, open, read, write and delete files). The interactions of such applications with the file system generally hide the specifics of the media (e.g., non-volatile solid state media, volatile solid state media, magnetic, non-removable media and removable media (both optical and magnetic)). However, according to one aspect of the invention, a background scheduler is provided that can, in addition to or instead of utilizing the file system interface, utilize lower-level communications (e.g., communications with a generic or controller-specific NAND driver). Such lower-level communications can perform page rewrite operations as described in greater detail below. The background scheduler is implemented as a series of computer program code embedded in a computer memory that controls a microprocessor, an embedded processor or another programmable central processing unit to perform the instructions of the embedded computer program code. The program code for the background scheduler can be stored in the non-volatile memory and/or the central DRAM of the system during execution.

A non-volatile memory (e.g., a NAND memory) can be divided in two parts: a main area and a spare area. The main area is used to store data while the spare area, also called out-of-band (oob), usually stores error correcting code (ECC) information, an indication of bad blocks and journaling for some file system. When recharging the non-volatile memory, these two areas must be rewritten, keeping their original content and preferably keeping their original position. As used herein, a block is a group of pages that are erased together. For example, in one embodiment, 2 kbyte pages are grouped into sets of 32 pages to form a 64 kbyte block, and the 64 kbyte block is erased as a group, even though 2k pages can be read and/or rewritten separately. Thus, for embodiments discussed below where an erase operation is not needed, a single page can be read and rewritten. However, in embodiments where an erase operation is needed, a whole block is read, erased and rewritten. Accordingly, while the operations below are described in terms of operations on blocks, one of ordinary skill in the art would understand that the operations can instead be performed on pages instead when erase operations are not needed.

For maximum reliability, the blocks of the NAND memories to be written are erased prior to being written. (For a limited number of writes, a NAND memory may simply be rewritten to reinject charge into the floating gate cells of the MOSFETs without first performing and erase operation.) Thus, in general the process to recharge the device is: first read the block and then write the contents back to the same position, where the process of writing back may be preceded by an erase operation. In case of an error during the read operation or if a block is marked as bad, it cannot be erased since its content will not be restored. Retries on failures of each operation increases the chances to have the pages properly recharged.

The process to recharge a block must be an atomic operation, i.e. the steps from read to rewrite must not be interrupted. (This helps to avoid process possible data corruption that could occur if another process were able to rewrite a block after the background scheduler had read the contents of the block but before the background scheduler had rewritten the block.) To accomplish that the block of the NAND has to be locked during the operation in order to prevent any external access to it while the pages in the block are being recharged. Thus, the background scheduler performs I/O control calls to lock the block before starting the read operation and performs I/O control calls to unlock the page after verifying that the rewrite operation has completed successfully. (Locking may be omitted in the case of areas of the memory where there can be only one writer (e.g., in the pool of reserved blocks in the spare area as described in greater detail below).)

Recharging/rewriting a block is run independent of the file system, and the file system independent rewrite process is described in greater detail below. By interacting directly with the non-volatile memory or its controller, the process can address blocks and pages individually, skip any possible address mapping from the file system and ensure that all pages are recharged. To minimize system contention, it can also add a delay between rewriting pages or blocks in order to allow other accesses to the NAND between two successive page recharges or block erases/rewrites. This way the system does not halt waiting for the completion of the NAND rewrite/recharge process.

Finally, the issue of reliability of data becomes more critical as memory manufacturers seek to remain competitive by moving to smaller lithography and smaller cell size to fit more bits in the same size die. Storing multiple bits per cell is already a reality, which requires more elaborate software to improve reliability, like multiple bit correction ECC.

Figure 2:
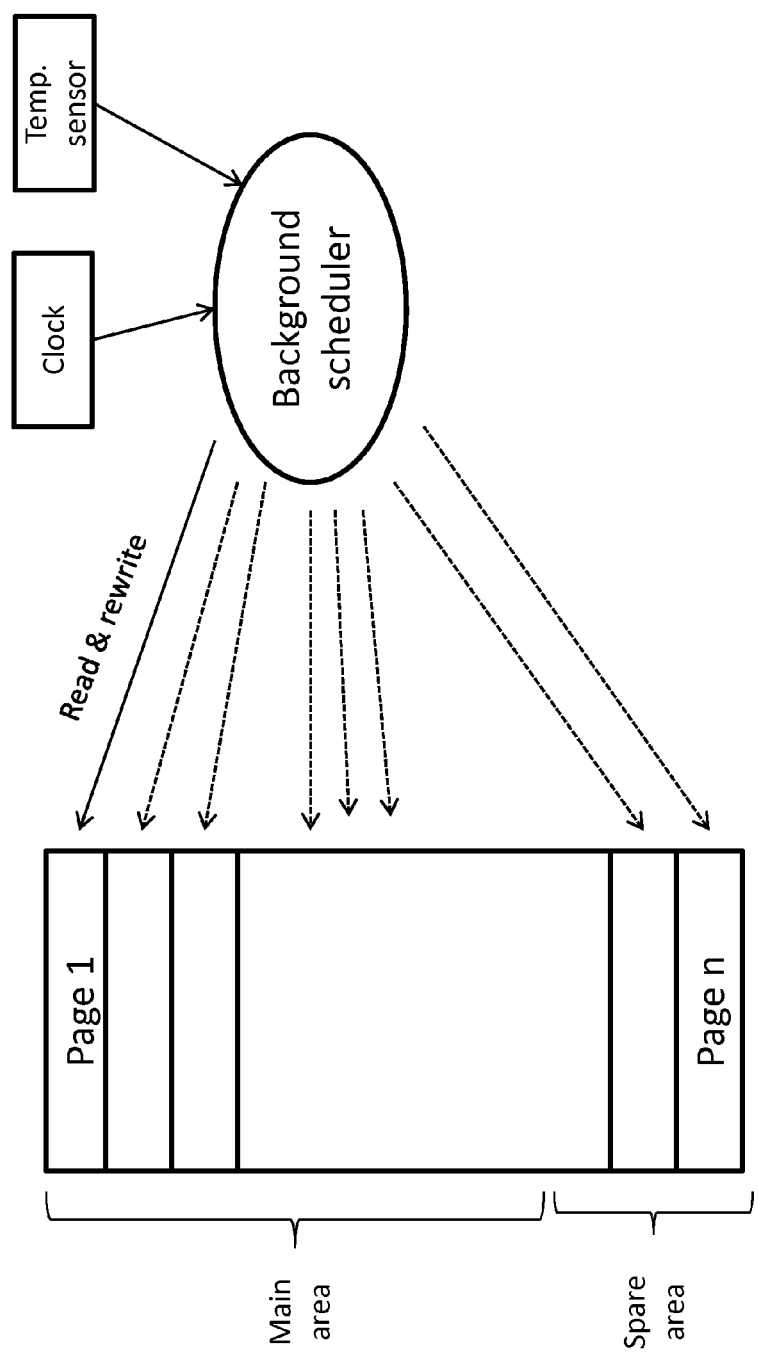
FIG. 2 is a conceptual illustration of a background scheduler rewriting the contents of an entire non-volatile memory to reduce data loss.

As shown in FIG. 2, one embodiment of a background scheduler addresses the potential for data corruption caused by charge loss by rewriting the entire non-volatile memory (e.g., NAND memory) with the exact same content at recurring intervals (e.g., by utilizing time information from a clock/timer), but without requiring an erase operation between the read and the rewrite. After the rewrite operation has occurred, the background scheduler can perform a read of the rewritten page/block to ensure that it has been properly rewritten. If not, a number of retry operations may be utilized, optionally with an erase prior to attempting to retry the rewrite.

In one embodiment, the frequency is fixed based on design parameters that take into consideration the temperature at which the non-volatile memory operates. The frequency is preferably selected so that writes to the non-volatile memory are not so frequent that they substantially reduce the number of rewrites to the non-volatile memory that can be made by applications other than the background scheduler. The frequency is preferably selected so that writes to the non-volatile memory are not so frequent that they substantially interfere with reads from and/or writes to the non-volatile memory from applications other than the background scheduler. The frequency is preferably selected so that writes to the non-volatile memory are frequent enough that they avoid data loss before irreversible data loss can occur. In one embodiment, where a non-volatile memory is used in a known operating temperature range, the frequency is set to no more than 75% of the estimated data retention time. For example, for a non-volatile memory operating around 30-35 degrees C., the data retention time is estimated to vary from 82-56 months. The average therefore is 69 months, and 75% of 69 months is approximately 52 months. However, in a more conservative embodiment, the frequency is set to no more than 50% of the estimated data retention time or approximately 34 months in the above-example. In an even more conservative embodiment, the frequency is set to no more than 25% of the estimated data retention time or approximately 17 months in the above-example.

Alternatively, in some embodiments, for example where the operating temperature of the non-volatile memory may vary widely or the designer wishes to be extremely conservative, the time may be set to a period (e.g., once per month or once per week) over which data loss is extremely unlikely but which does not substantially compromise data writes by other applications or cause interference, as described above.

In another embodiment, also shown in FIG. 2, the background scheduler may be provided with an interface to a temperature sensor that enables the background scheduler to track the operating range of the system housing the non-volatile memory. In such an embodiment, the frequency of the updates provided by the background scheduler can be adjusted dynamically to account for changes in estimated data retention times based on changing temperature.

In yet another embodiment, the frequency may be updated dynamically by notifying the background scheduler of a new update frequency. For example, the background scheduler may read a configuration file (e.g., at boot-up time or periodically) to determine the frequency to be used.

Figure 3:
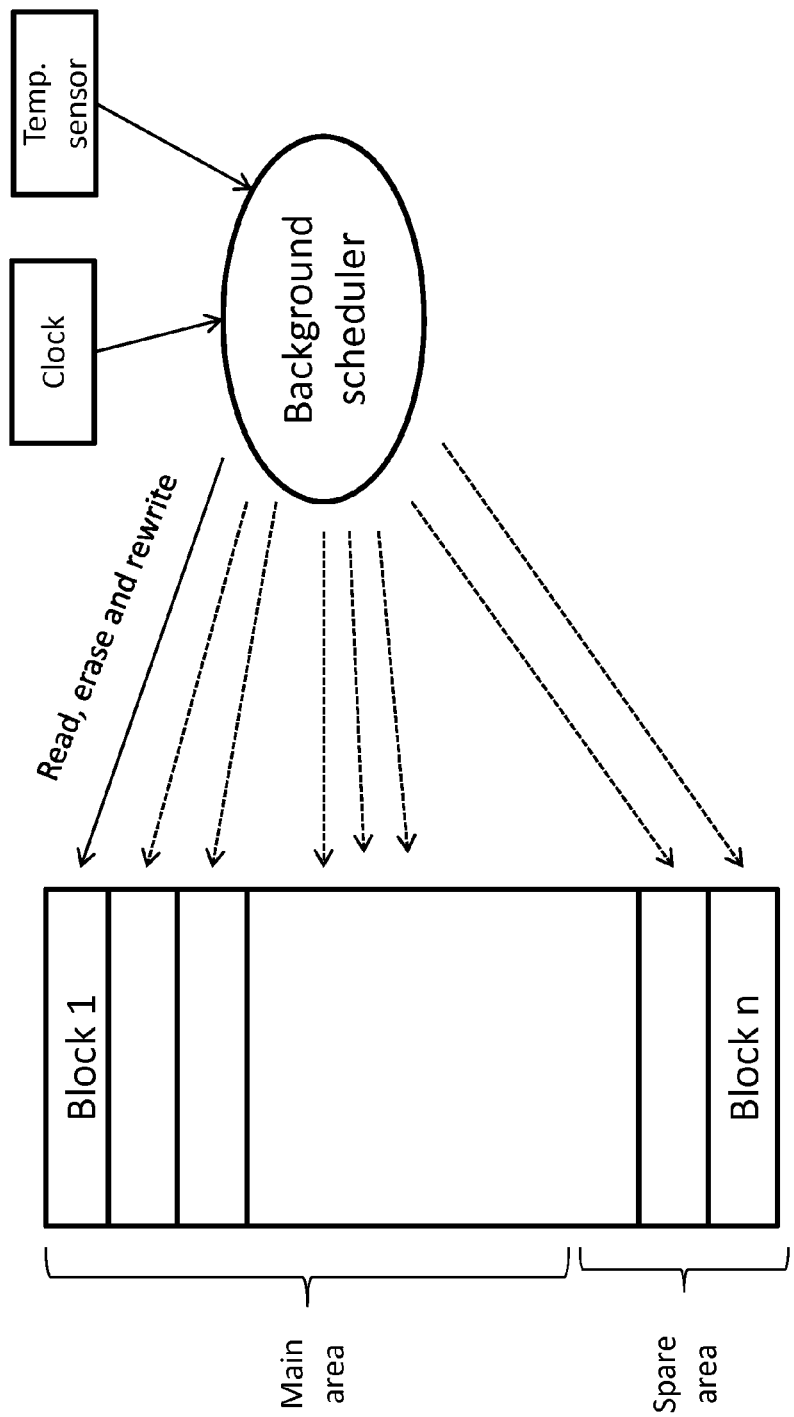
FIG. 3 is a conceptual illustration of a background scheduler erasing and rewriting the contents of an entire non-volatile memory to reduce data loss.

As shown in FIG. 3, the background scheduler may utilize a rewrite/update process based on blocks of data where each block contains at least one page of data. In the atomic rewrite/update process of FIG. 3, a block to be updated is locked, read, erased, rewritten and unlocked, utilizing retries where necessary. Such an embodiment may be used interspersed with the embodiment of FIG. 2 or by itself. For example, if a page can be rewritten approximately four times without performing an erase operation, the background scheduler may utilize the embodiment of FIG. 3 a few times (e.g., 2 times) for every time it utilizes the embodiment of FIG. 2.

Figure 4:
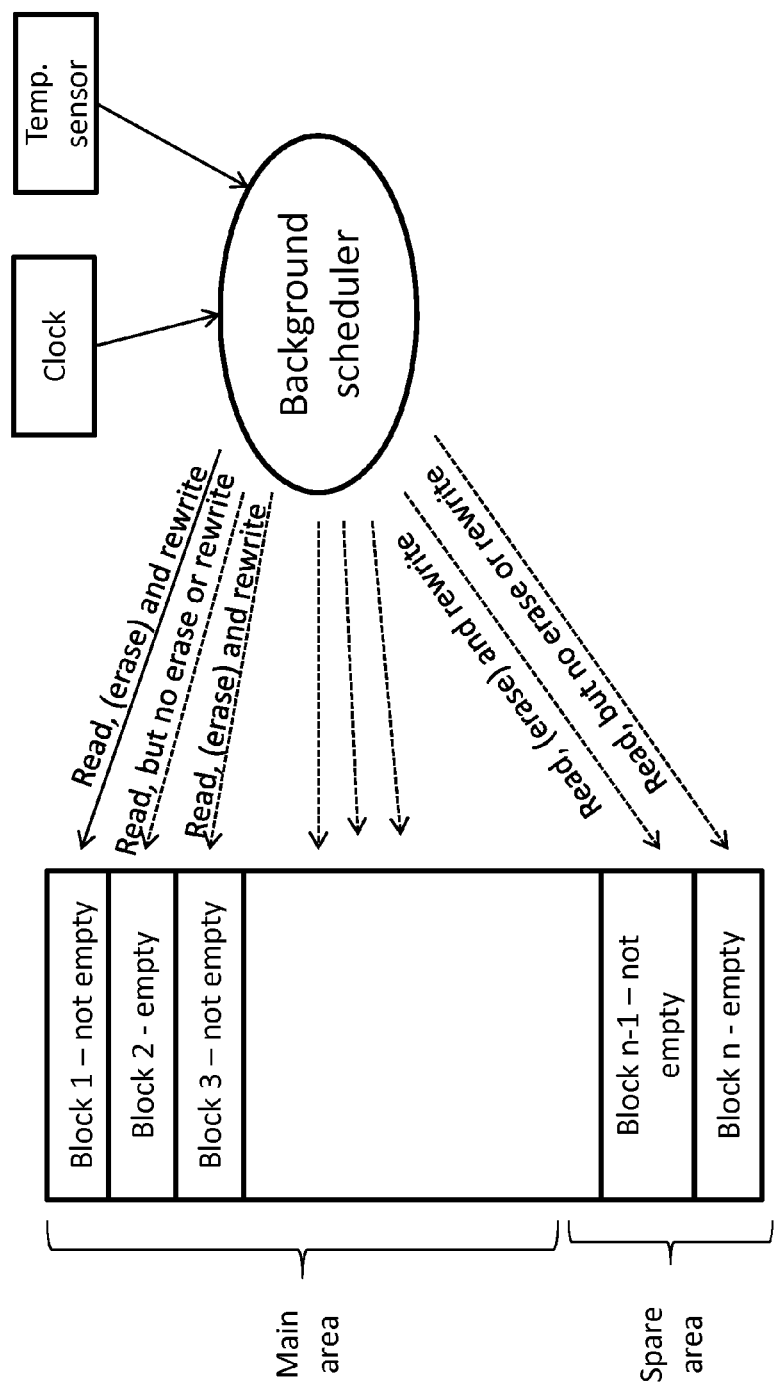
FIG. 4 is a conceptual illustration of a background scheduler rewriting the contents of non-empty blocks in a non-volatile memory to reduce data loss.

As shown in FIG. 4, the background scheduler can be enhanced to utilize information stored in the non-volatile memory to determine if a rewrite of a particular page needs to be performed. For example, if the background scheduler determines that a page is empty (e.g., contains all ones), then the page need not be rewritten as no charge was injected into the floating gate cells of the page that could be lost over time.

Figure 5:
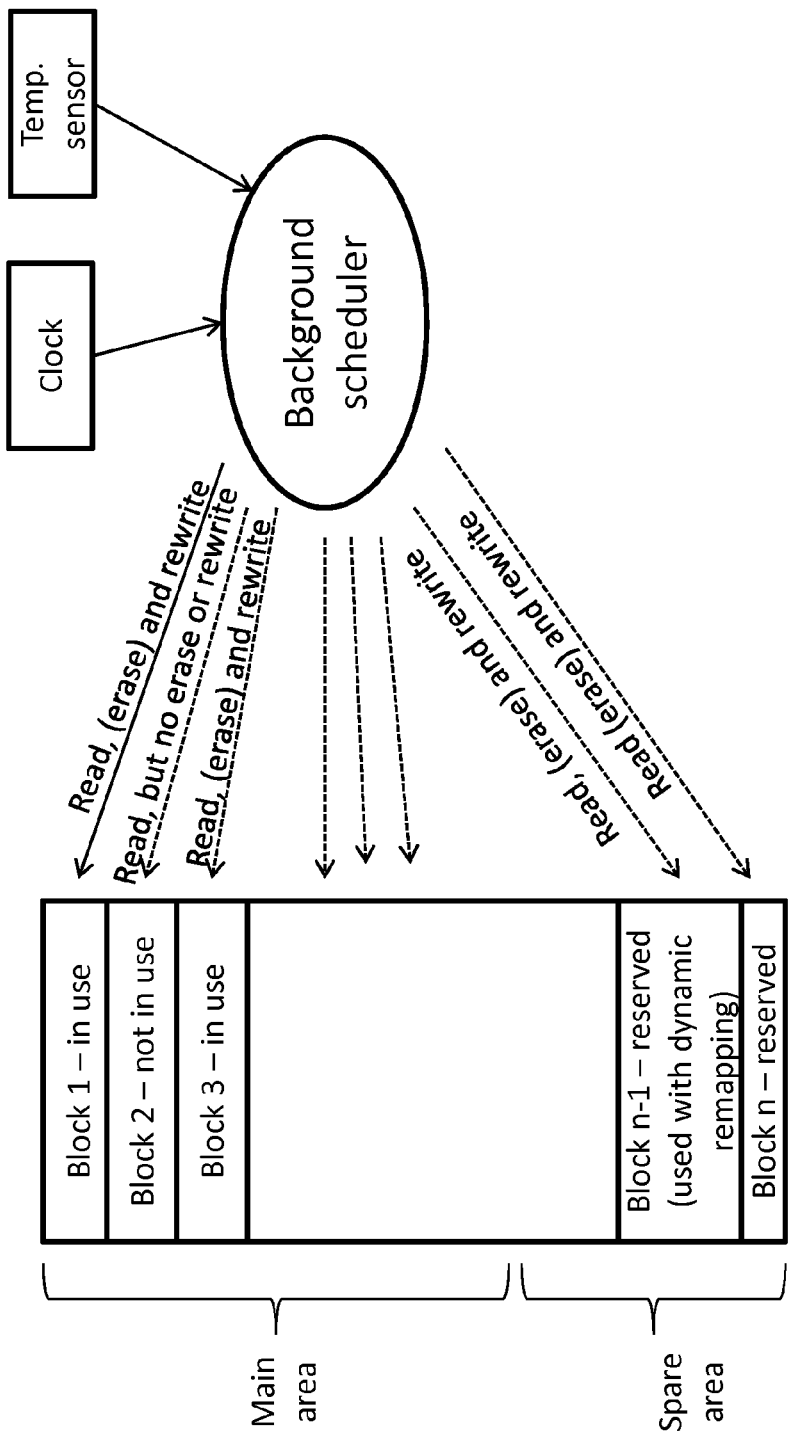
FIG. 5 is a conceptual illustration of a background scheduler rewriting the contents of unused blocks in a non-volatile memory to reduce data loss.

As shown in FIG. 5, the background scheduler can be enhanced to utilize file system specific information stored in the non-volatile memory to determine if a rewrite of a particular page needs to be performed. For example, if the background scheduler determines that a page is not in use by the file system (even if it has old data in it), then the page need not be rewritten as data loss in that page will not result in an error to any of the files in use in the system.

In yet another embodiment, should the background scheduler be unable to rewrite a page after it has been erased, the background scheduler will cause the corresponding page to be marked as a bad page (or block) so that later reads from that page (or block) will fail (as opposed to reading incorrect data).

In a further modification of such an embodiment, as shown in FIG. 5, the background scheduler may be able to rewrite the data to a reserved block of a number of reserved blocks in a pool of reserved blocks (e.g., in the spare area) and then inform at least one of the drivers that a dynamic block remapping is required such that file system read accesses for the original block location are instead handled by the reserved area. If and when the file system rewrites the block being handled by the reserved block, the driver can return an error code for an attempt to write that block such that the file system will mark that block as a bad block, and the file system will then write the block contents to another location. The reserved block can be added back to the pool of reserved blocks for use by another block should a rewrite of the other block fail in the future.

In yet a further embodiment of the background scheduler, the scheduler may perform the rewrite process in separately scheduled parts. For example, the non-volatile memory can be considered as being broken into groups of blocks (e.g., four groups of blocks) such that only the blocks in a particular group are rewritten at a particular time. In such an embodiment, the blocks belonging to the first group may be rewritten at a first time (e.g., during the first week of the month), whereas the blocks belonging to the second, third and fourth groups would be rewritten at second, third and fourth times, respectively (e.g., during the second, third and fourth weeks of the month, respectively). In such an embodiment, each of the optimizations of FIGS. 2-5 can likewise be applied to the blocks within the group.

In another embodiment, the spare area may further be configured to include a timestamp for each blocks in the non-volatile such that a time of a last blocks to a page can be determined. If the time since the last write is less than a known fractional part of the period for rewriting (e.g., 50% of a one month rewrite period), the background scheduler may be configured to skip rewriting such a blocks.

The above system can be incorporated into both stand-alone computer systems as well as embedded systems. For example, a remote access device, such as a keyboard, video mouse (KVM) switch can act as an embedded system that utilizes the data loss prevention method described herein.

While certain configurations of structures have been illustrated for the purposes of presenting the basic structures of the present invention, one of ordinary skill in the art will appreciate that other variations are possible which would still fall within the scope of the appended claims. For example, while the above discussion has been given in terms on a particular kind of non-volatile memory, other non-volatile memories that are subject to data loss can also be used. For example, other semiconductor-based memories (e.g., ferroelectric memories), magnetic-based memories (e.g., floppy disks, tapes and hard disks) and optical memories (e.g., rewritable CDs and DVDs) can also use the process described herein.

The invention claimed is:

1. A computer system having files stored in a computer file system, the computer system comprising:
    a central processing unit;
    a non-volatile memory coupled to the central processing unit; and
    memory containing computer program code embedded therein, wherein the computer program code controls the central processing unit to determine if a file system independent rewrite process should occur, and, if the file-system independent rewrite process should occur, controls the central processing unit to read at least one page of the non-volatile memory and rewrite the at least one page of non-volatile memory into the non-volatile memory such that each rewritten page of the at least one page appears to the file system to be in the same location after being rewritten as before being rewritten, wherein determining if the file system independent rewrite process should occur comprises determining a temperature of the embedded system and determining based on the temperature if at least a temperature-specific period of time has elapsed since a last rewrite process occurred.

2. The computer system as claimed in claim 1, wherein the at least one page comprises all pages in a first group of pages but excludes all pages in a second group of pages.

3. The computer system as claimed in claim 1, wherein the at least one page comprises all pages in at least one block, the file system independent rewrite process further comprising erasing the at least one block of the non-volatile memory between reading and rewriting the least one block of the non-volatile memory.

4. The computer system as claimed in claim 1, further comprising:
    locking the least one page of the non-volatile memory before reading the least one page of the non-volatile memory; and
    unlocking the least one page of the non-volatile memory after confirming that the rewriting of the least one page of the non-volatile memory was successful.

5. The computer system as claimed in claim 1, further comprising for each page of the least one page of the non-volatile memory:
    determining if the rewriting of the each page failed and retrying the rewriting of the each page until at least one of a successful rewrite or a threshold number of retries has occurred.

6. The computer system as claimed in claim 5, wherein the at least one page comprises all pages in at least one block, the file system independent rewrite process further comprising marking the each block as a bad block if the each block has not been successfully rewritten after the threshold number of retries has occurred for the each block.

7. The computer system as claimed in claim 5, further comprising:
    writing the each page to a corresponding reserved page of a pool of reserved pages if the each page has not been successfully rewritten after the threshold number of retries has occurred for the each page; and
    dynamically remapping read requests for the each page to the corresponding reserved page to which the each page has been written if the each page has not been successfully rewritten after the threshold number of retries has occurred for the each page.

8. The computer system as claimed in claim 7, further comprising:
returning an error code when the file system attempts to write to a dynamically remapped page for which data is being stored in the pool of reserved pages;
marking the dynamically remapped page as a bad page; and
freeing from the pool of reserved pages the reserved page corresponding to the dynamically remapped page.

9. The computer system as claimed in claim 1, wherein the at least one page comprises at least first and second pages and a programmed delay is used between rewriting the first page and rewriting the second page to allow the file system to access the non-volatile memory between rewriting the first page and rewriting the second page.

10. The computer system as claimed in claim 1, wherein the memory containing the computer program code for controlling the file-system independent rewrite process is the non-volatile memory.

11. The computer system as claimed in claim 1, wherein the memory containing the computer program code for controlling the file-system independent rewrite process is at least one dynamic random access memory (DRAM) module.

12. The computer system as claimed in claim 1, wherein the non-volatile memory comprises a solid state memory.

13. The computer system as claimed in claim 12, further comprising:
locking the least one page of the non-volatile memory before reading the least one page of the non-volatile memory; and
unlocking the least one page of the non-volatile memory after confirming that the rewriting of the least one page of the non-volatile memory was successful.

14. The computer system as claimed in claim 13, further comprising erasing the at least one page of the non-volatile memory between reading and rewriting the least one page of the non-volatile memory.

15. The computer system as claimed in claim 12, wherein the solid state memory comprises a NAND flash.

16. The computer system as claimed in claim 1, wherein the central processing unit comprises a microprocessor.

17. The computer system as claimed in claim 1, wherein the central processing unit comprises an embedded processor.

18. The computer system as claimed in claim 1, wherein the non-volatile memory comprises a magnetic-based memory.

19. The computer system as claimed in claim 18, wherein the magnetic-based memory comprises a platter of a hard disk drive.

20. The computer system as claimed in claim 1, wherein the non-volatile memory comprises an optical-based memory.

21. The computer system as claimed in claim 20, wherein the optical-based memory comprises at least one of a rewritable CD and a rewritable DVD.

22. The computer system as claimed in claim 1, wherein the computer system comprises an embedded system.

23. The computer system as claimed in claim 22, wherein the embedded system comprises a remote access device.

24. The computer system as claimed in claim 23, wherein the remote access device comprises a keyboard, video and mouse (KVM) switch.

25. A computer system having files stored in a computer file system, the computer system comprising:
a central processing unit;
a non-volatile memory coupled to the central processing unit; and
memory containing computer program code embedded therein, wherein the computer program code controls the central processing unit to determine if a file system independent rewrite process should occur, and, if the file-system independent rewrite process should occur, controls the central processing unit to read at least one page of the non-volatile memory and rewrite the at least one page of non-volatile memory into the non-volatile memory such that each rewritten page of the at least one page appears to the file system to be in the same location after being rewritten as before being rewritten, wherein the at least one page comprises all non-empty pages in a first group of pages but excludes all empty pages in the first group of pages and all empty and non-empty pages in a second group of pages.

26. A computer system having files stored in a computer file system, the computer system comprising:
a central processing unit;
a non-volatile memory coupled to the central processing unit; and
memory containing computer program code embedded therein, wherein the computer program code controls the central processing unit to determine if a file system independent rewrite process should occur, and, if the file-system independent rewrite process should occur, controls the central processing unit to read at least one page of the non-volatile memory and rewrite the at least one page of non-volatile memory into the non-volatile memory such that each rewritten page of the at least one page appears to the file system to be in the same location after being rewritten as before being rewritten, wherein the at least one page comprises all pages in a first group of pages that are in use in the file system but excludes (1) all pages in the first group of pages that are not in use in a file system and (2) all pages in a second group of pages.

* * * * *